US010892764B1

(12) United States Patent
Okuno (10) Patent No.: US 10,892,764 B1
(45) Date of Patent: Jan. 12, 2021

(54) DELAY LOCKED LOOP DEVICE AND UPDATE METHOD THEREOF

(71) Applicant: Winbond Electronics Corp., Taichung (TW)

(72) Inventor: Shinya Okuno, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/993,272

(22) Filed: Aug. 14, 2020

(51) Int. Cl.
*H03L 7/081* (2006.01)

(52) U.S. Cl.
CPC .................................. *H03L 7/0812* (2013.01)

(58) Field of Classification Search
CPC ........................................................ H03L 7/0812
USPC .................................. 327/147–149, 156–158
See application file for complete search history.

(56) References Cited

U.S. PATENT DOCUMENTS

| | | | | |
|---|---|---|---|---|
| 6,778,003 B1 * | 8/2004 | Callaway | .................. | G06F 1/26 327/536 |
| 7,639,552 B2 * | 12/2009 | Ku | ........................... | G11C 7/12 327/156 |
| 8,023,608 B2 * | 9/2011 | Jang | ....................... | G11C 7/106 375/376 |
| 8,666,013 B1 * | 3/2014 | Khor | ....................... | H04L 7/033 375/376 |
| 8,769,194 B2 | 7/2014 | Fujisawa | | |
| 8,988,966 B2 * | 3/2015 | Kwak | .................. | G11C 7/1066 365/233.1 |
| 9,865,317 B2 * | 1/2018 | Ishibashi | .................. | G11C 8/10 |
| 10,061,541 B1 * | 8/2018 | Lee | .......................... | G11C 8/12 |
| 10,141,041 B1 * | 11/2018 | Lee | .................... | G11C 11/40603 |
| 2002/0051396 A1 * | 5/2002 | Higashiho | ........... | G11C 11/4076 365/222 |
| 2004/0079968 A1 * | 4/2004 | Takahashi | ............. | G11C 11/406 257/200 |
| 2005/0078539 A1 * | 4/2005 | Schoenfeld | .............. | G11C 7/22 365/222 |
| 2006/0028905 A1 * | 2/2006 | Johnson | ................ | H03L 7/0812 365/233.1 |
| 2006/0062341 A1 * | 3/2006 | Edmondson | ............ | H03L 7/107 375/376 |
| 2007/0069772 A1 * | 3/2007 | Choi | .................... | G11C 7/1072 327/158 |
| 2007/0069775 A1 * | 3/2007 | Ku | ....................... | G11C 11/4076 327/158 |

(Continued)

FOREIGN PATENT DOCUMENTS

| | | |
|---|---|---|
| CN | 107872200 | 4/2018 |
| TW | I563803 | 12/2016 |

*Primary Examiner* — Adam D Houston
(74) *Attorney, Agent, or Firm* — JCIPRNET (57) ABSTRACT

A delay locked loop device (DLL) and an update method therefor are provided. The DLL device includes a DLL and an update circuit. The DLL is enabled according to an enable signal, thereby delaying an input clock to provide a delayed clock. The update circuit includes a flag generating circuit and an enable circuit. The flag generating circuit provides an update flag based on a default time interval. The enable circuit triggers the enable signal to a first logic level according to the update flag, and transitions the enable signal from the first logic level to a second logic level before the end of the default time interval. The default time interval is shorter than the refresh cycle of the memory.

16 Claims, 8 Drawing Sheets

(56) References Cited

U.S. PATENT DOCUMENTS

| | | | |
|---|---|---|---|
| 2007/0069778 A1* | 3/2007 | Choi | H03L 7/0805 327/158 |
| 2008/0238507 A1* | 10/2008 | Shim | H03L 7/0818 327/158 |
| 2008/0297215 A1* | 12/2008 | Ma | H03L 7/07 327/158 |
| 2009/0033385 A1* | 2/2009 | Heragu | H03L 7/085 327/158 |
| 2009/0315600 A1* | 12/2009 | Becker | H03L 7/0814 327/158 |
| 2014/0362653 A1* | 12/2014 | Iwasaki | G11C 11/4096 365/193 |
| 2015/0036445 A1* | 2/2015 | Yoshida | G11C 11/40611 365/222 |
| 2019/0036535 A1* | 1/2019 | Takahashi | H03L 7/091 |
| 2019/0164583 A1* | 5/2019 | Penney | G11C 11/4072 |

* cited by examiner

DELAY LOCKED LOOP DEVICE AND UPDATE METHOD THEREOF

BACKGROUND

1. Technical Field

The disclosure relates to a delay locked loop device and an update method thereof, in particular, to a delay locked loop device and an update method thereof capable of reducing power consumption.

2. Description of Related Art

When the DRAM temperature increases or decreases, the delay locked loop (DLL) updates the delay code to adjust the internal timing of the memory device. Generally speaking, the delay locked loop can be updated at any time by a delay code, so that the delay clock provided by the delay locked loop can be changed in real time with temperature. However, the above solution has a large power consumption.

SUMMARY

The disclosure provides a delay locked loop device and an update method thereof capable of reducing power consumption.

The delay locked loop device of the disclosure can be applied to a memory device. The delay locked loop device includes a delay locked loop and an update circuit. The delay locked loop is configured to receive an input clock after being enabled according to an enable signal and delay the input clock to provide a delayed clock. The update circuit includes a flag generating circuit and an enable circuit. The flag generating circuit is configured to provide an update flag based on a default time interval. The enable circuit is coupled to the flag generating circuit and the delay locked loop. The enable circuit is configured to trigger the enable signal to a first logic level according to the update flag and transition the enable signal from the first logic level to a second logic level before the end of the default time interval. The default time interval is shorter than a refresh cycle of the memory device.

In the disclosure, an update method for updating a delay locked loop is suitable for a memory device. The update method includes: providing an update flag based on a default time interval, wherein the default time interval is shorter than a refresh cycle of the memory device; triggering the enable signal to a first logic level according to the update flag and transitioning the enable signal from the first logic level to a second logic level before the end of the default time interval; and enabling the delay locked loop according to the enable signal so that the delay locked loop delays an input clock to provide a delayed clock.

In summary, the disclosure provides an update flag based on a default time interval, triggers an enable signal to a first logic level according to the update flag, and transitions the enable signal from the first logic level to a second logic level before the end of the default time interval. The disclosure enables the delay locked loop within the default time interval. Therefore, the delay locked loop updates a delay code only within the default time interval, thereby reducing the power consumption of the delay locked loop.

In order to make the above-mentioned features and advantages of the disclosure more obvious and understandable, the embodiments are specifically described below in conjunction with the accompanying drawings for detailed description as follows.

DESCRIPTION OF THE EMBODIMENTS

Figure 1:
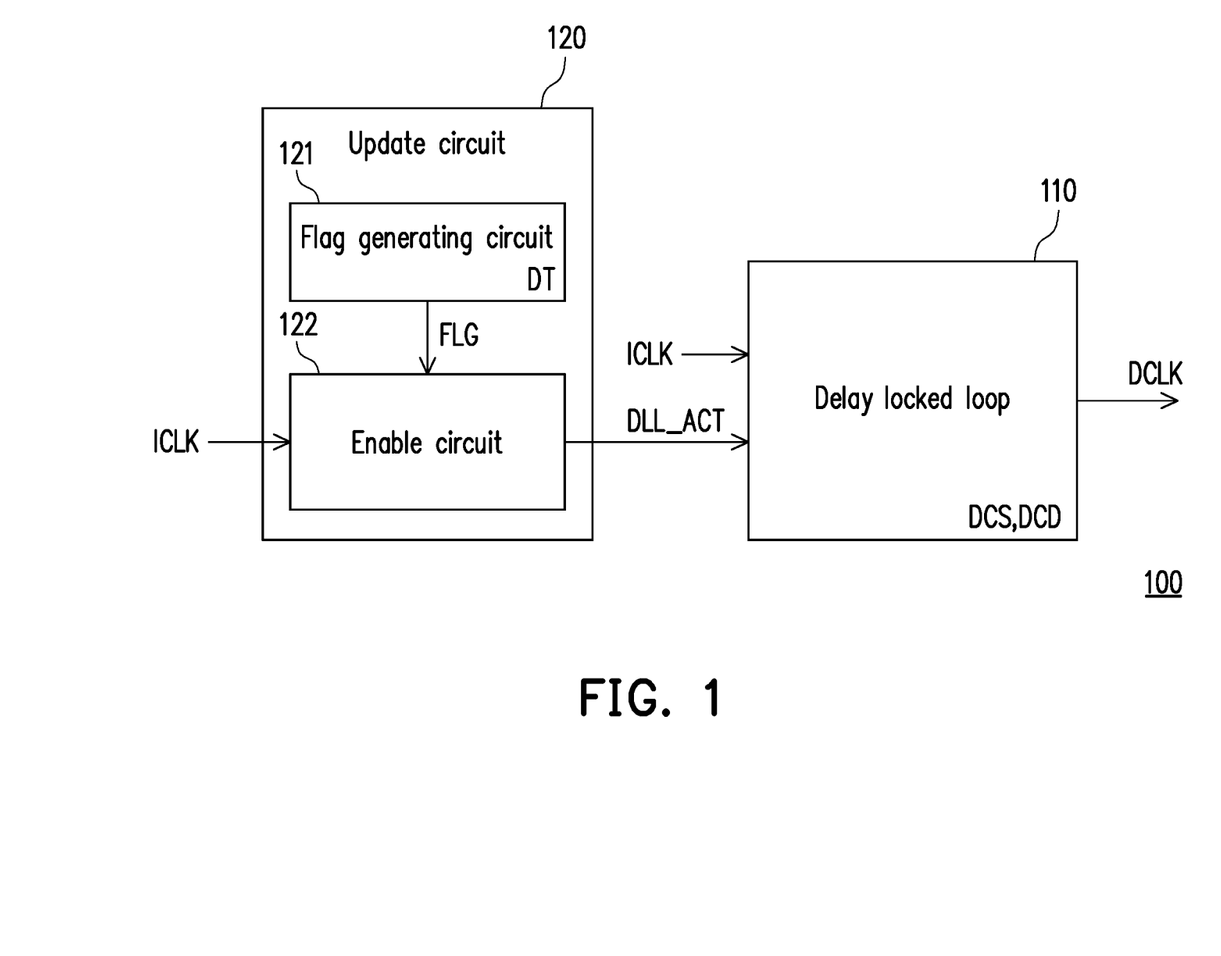
FIG. 1 is a schematic diagram of a delay locked loop device according to an embodiment of the disclosure.

Please refer to FIG. 1. FIG. 1 is a schematic diagram of a delay locked loop device according to an embodiment of the disclosure. In this embodiment, the delay locked loop device 100 is used in a memory device. The delay locked loop device 100 includes a delay locked loop 110 and an update circuit 120. The delay locked loop 110 receives an input clock ICLK after being enabled according to an enable signal DLL_ACT and delays the input clock ICLK to provide a delayed clock DCLK. In this embodiment, the update circuit 120 includes a flag generating circuit 121 and an enable circuit 122. The flag generating circuit 121 provides an update flag FLG based on a default time interval DT. The default time interval DT is shorter than a refresh cycle of the memory device. For example, if the refresh cycle of the memory device is 7.8 microseconds, the time of the default time interval DT may be set to 4 microseconds (this disclosure is not limited thereto). The enable circuit 122 is coupled to the flag generating circuit 121 and the delay locked loop 110. The enable circuit 122 triggers a logic level of the enable signal DLL_ACT to a first logic level according to the update flag FLG (for example a high logic level, but the disclosure is not limited thereto). For example, the delay locked loop 110 is enabled in response to DLL_ACT having the first logic level to provide a delay control signal DCS, and generates a corresponding delay code DCD according to a delay command in the delay control signal DCS. The enable circuit 122 also further transitions the enable signal DLL_ACT from the first logic level to a second logic level (such as a low logic level but the disclosure is not limited thereto) before the end of the default time interval DT. The second logic level is different from the first logic level.

In this embodiment, the duration that the enable signal DLL_ACT maintains at the first logic level is shorter than the default time interval DT. In other words, the duration that the enable signal DLL_ACT maintains at the first logic level is shorter than a refresh cycle of the memory device. The delay locked loop 110 updates the delay code only within the default time interval DT, thereby reducing the power consumption of the delay locked loop 110 itself. In addition, a provision cycle of the update flag FLG is shorter than the refresh cycle when the default time interval DT is shorter than the refresh cycle of the memory device. Therefore, in this embodiment, the delayed clock DCLK provided by the delay locked loop 110 can be changed along with the temperature.

Figure 2:
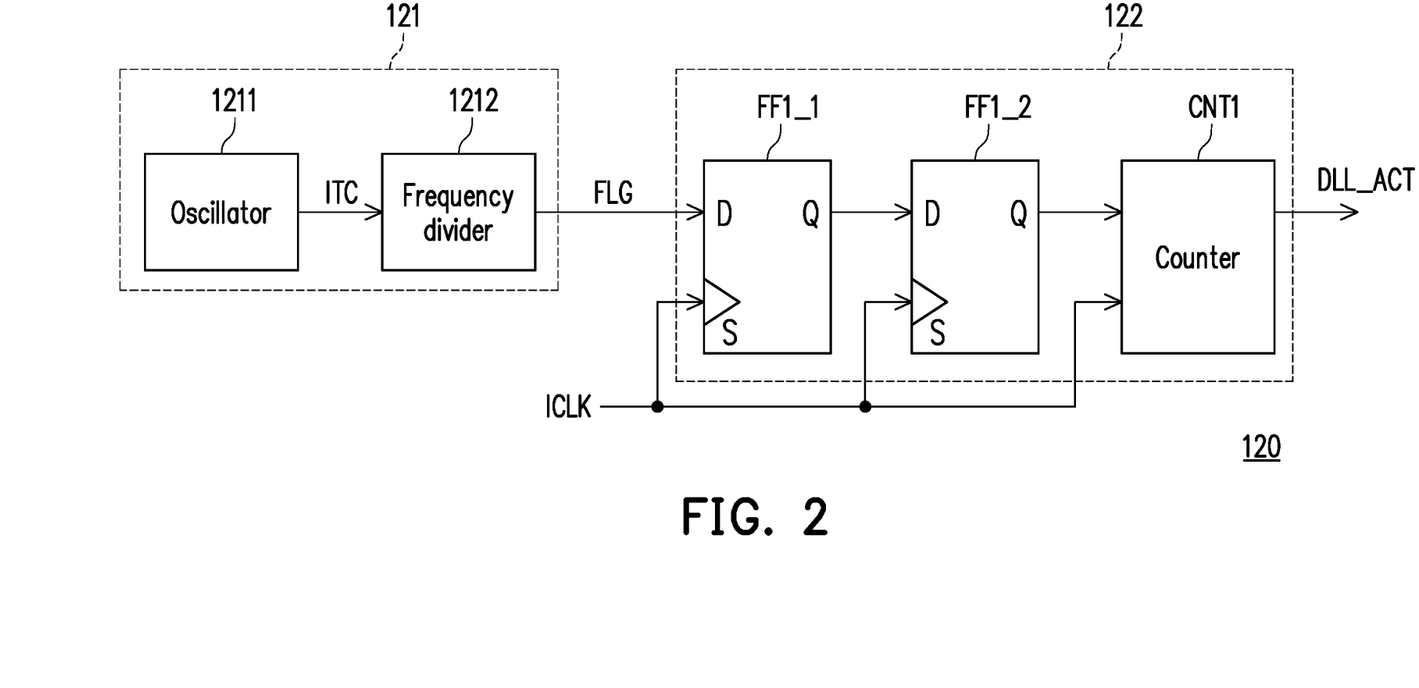
FIG. 2 is a schematic circuit diagram of an update circuit according to the first embodiment of the disclosure.

Please refer to both FIG. 1 and FIG. 2. FIG. 2 is a schematic circuit diagram of an update circuit according to the first embodiment of the disclosure. In this embodiment, the flag generating circuit 121 includes an oscillator 1211 and a frequency divider 1212. The oscillator 1211 provides an internal clock ITC. The frequency divider 1212 is coupled to the oscillator 1211 and the enable circuit 122. The frequency divider 1212 divides the internal clock ITC. After frequency division, the frequency divider 1212 makes the cycle of the internal clock ITC substantially equal to the default time interval DT, thereby converting the internal clock ITC to the update flag FLG.

In this embodiment, the enable circuit 122 includes flip-flops FF1_1 and FF1_2, and a counter CNT1. The flip-flops FF1_1 and FF1_2 are coupled in series with each other. Setting input terminals S of the flip-flops FF1_1 and FF1_2 respectively receive the input clock ICLK. A data input terminal D of the flip-flop FF1_1 is coupled to the frequency divider 1212, thereby receiving the update flag FLG from the frequency divider 1212. An output terminal Q of the flip-flop FF1_1 is coupled to a data input terminal D of the flip-flop FF1_2. An output terminal Q of the flip-flop FF1_2 is used to output the enable signal DLL_ACT. In this embodiment, the flip-flops FF1_1 and FF1_2 coupled in series can synchronize with the update flag FLG by the first input clock ICLK after the update flag FLG is provided, and trigger the logic level of the enable signal DLL_ACT to the first logic level at the next input clock ICLK. In other words, the flip-flops FF1_1 and FF1_2 can delay the update flag FLG by one input clock ICLK to two input clocks ICLK, thereby generating the enable signal DLL_ACT having the first logic level. In some embodiments, the number of flip-flops may be more than two. In other words, the enable circuit 122 can delay the update flag FLG by multiple input clocks ICLK according to the number of flip-flops, thereby generating the enable signal DLL_ACT having the first logic level.

In this embodiment, the counter CNT1 is coupled to the output terminal Q of the flip-flop FF1_2 to receive the enable signal DLL_ACT. The counter CNT1 maintains the enable signal DLL_ACT at the first logic level when receiving the enable signal DLL_ACT, and counts the frequency of internal clock ICLK. When the frequency of the input clock ICLK reaches a default frequency, the counter CNT1 transitions the enable signal DLL_ACT from the first logic level to the second logic level.

Figure 3:
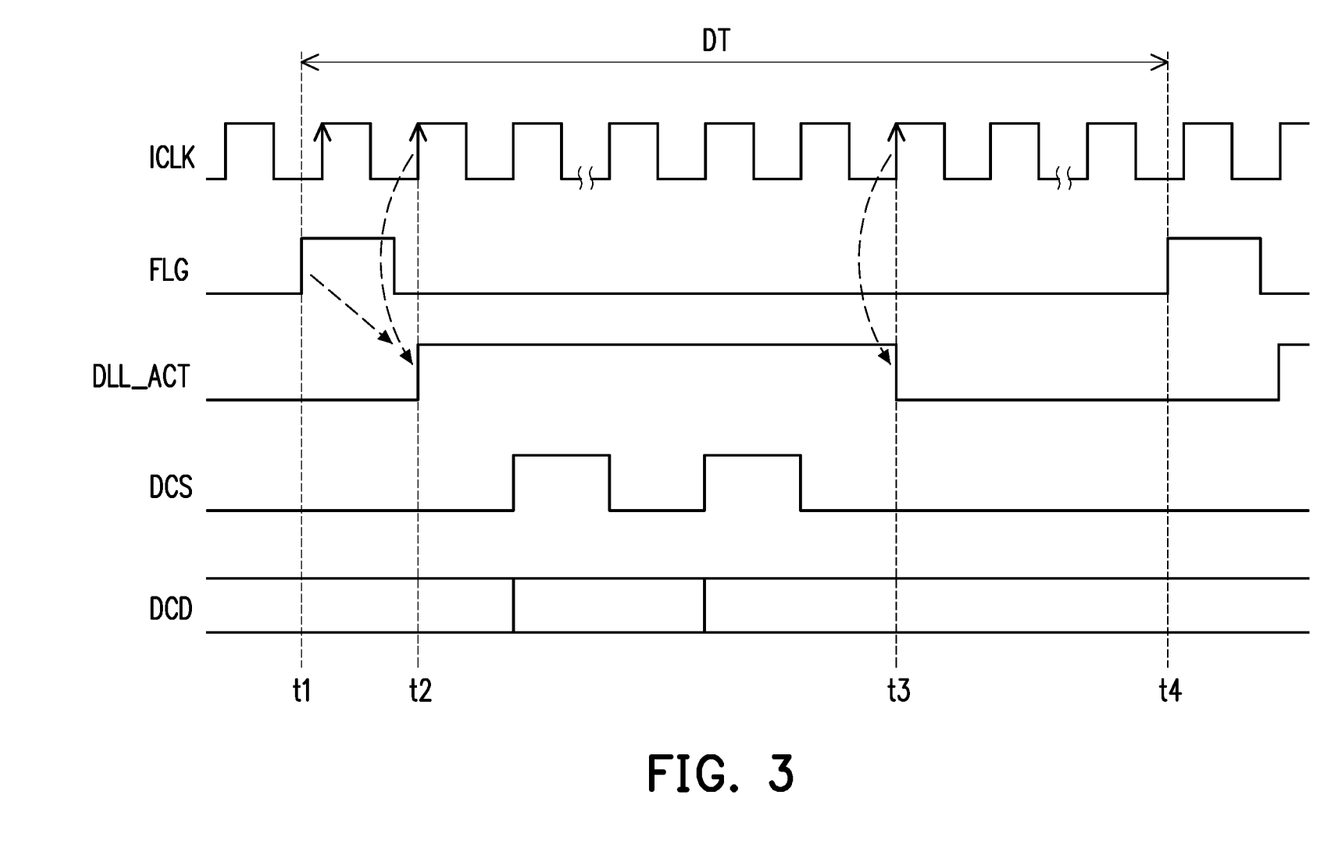
FIG. 3 is a signal timing diagram illustrated according to the first embodiment of the disclosure.

For example, please refer to FIG. 1 to FIG. 3. FIG. 3 is a signal timing diagram illustrated according to the first embodiment of the disclosure. In this embodiment, the flag generating circuit 121 provides the update flag FLG at time point t1 based on the default time interval DT. The default time interval DT is substantially equal to the duration from time point t1 to time point t4 (e.g. 4 microseconds). At time point t2 after the update flag FLG is provided (that is, after time point t1), the logic level of the enable signal DLL_ACT is triggered to the first logic level at the rising edge of the second input clock ICLK. Therefore, the delay locked loop 110 is enabled in response to the DLL_ACT having the first logic level to provide the delay control signal DCS, and generates the corresponding delay code DCD according to the delay command (UP or DN) in the delay control signal DCS.

At time point t2, the counter CNT1 of the enable circuit 122 also starts to count the input clock ICLK. In this embodiment, the counter CNT1 counts, for example, the number of rising edges of the input clock ICLK, but the disclosure is not limited thereto. In some embodiments, the counter CNT1 counts, for example, the number of falling edges of the input clock ICLK. In this embodiment, when the frequency of input clock ICLK reaches a default frequency (for example, 64 times), the counter CNT1 transitions the enable signal DLL_ACT from the first logic level to the second logic level at time point t3. Therefore, at time point t3, the delay locked loop 110 is disabled in response to the enable signal DLL_ACT having the second logic level.

In this embodiment, the duration of the default time interval DT and the default frequency can be appropriately set according to design requirements. Therefore, based on the above settings, the delay locked loop 110 updates the delay code DCD only within the default time interval DT, thereby reducing the power consumption of the delay locked loop 110. Moreover, in this embodiment, the delayed clock DCLK provided by the delay locked loop 110 can change instantaneously with the temperature when the duration of the default time interval DT (e.g. 4 microseconds) is shorter than the refresh cycle (e.g. 7.8 microseconds) of the memory device. In addition, in this embodiment, the enable signal DLL_ACT can be provided without relying on an external order of the memory device.

Figure 4:
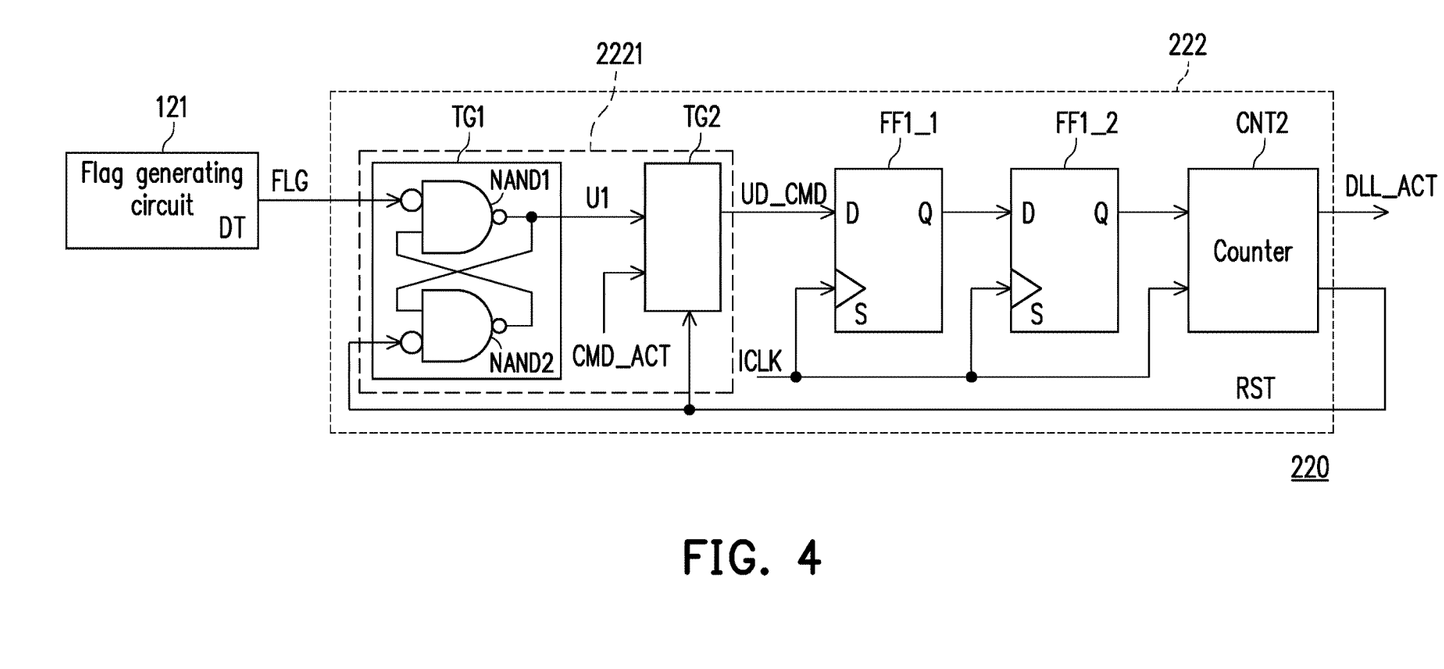
FIG. 4 is a schematic circuit diagram of an update circuit according to the second embodiment of the disclosure.

Please refer to both FIG. 1 and FIG. 4. FIG. 4 is a schematic circuit diagram of an update circuit according to the second embodiment of the disclosure. In this embodiment, an update circuit 220 includes a flag generating circuit 121 and an enable circuit 222. The enable circuit 222 includes an update command generator 2221, flip-flops FF1_1 and FF1_2, and a counter CNT2. The update command generator 2221 generates an update command UD_CMD in response to an enable command CMD_ACT after receiving the update flag FLG. In this embodiment, the update command generator 2221 may include triggers TG1 and TG2. The trigger TG1 is coupled to the flag generating circuit 121 to receive the update flag FLG. The trigger TG1 triggers the logic level of an output terminal U1 of the trigger TG1 to the first logic level in response to the rising edge of the update flag FLG. The trigger TG1 also transitions the logic level of the output terminal U1 of the trigger TG1 from the first logic level to the second logic level according to a reset signal RST.

In this embodiment, the trigger TG1 receives the update flag FLG and the reset signal RST, and inverts the update flag FLG and the reset signal RST. The trigger TG1 includes NAND gates NAND1 and NAND2. A first input terminal of the NAND gate NAND1 is used to receive the inverted update flag FLG. A second input terminal of the NAND gate NAND1 is coupled to an output terminal of the NAND gate NAND2. An output terminal of the NAND gate NAND1 is used as the output terminal U1 of the trigger TG1. A first input terminal of the NAND gate NAND2 is coupled to the output terminal of the NAND gate NAND1. A second input terminal of the NAND gate NAND1 is used to receive the inverted reset signal RST.

In this embodiment, the trigger TG2 is coupled to the output terminal U1 of the trigger TG1. In the case where the logic level of the output terminal U1 of the trigger TG1 is the first logic level, the trigger TG2 triggers the update command UD_CMD in response to the rising edge of the enable command CMD_ACT. In this embodiment, the update command generator 2221 can receive an external order (for example, an enable order) of the memory device. When receiving the external order, the update command generator 2221 triggers the enable command CMD_ACT according to the rising edge of the input clock ICLK. Therefore, in this embodiment, the rising edge of the enable command CMD_ACT synchronizes with the rising edge of the input clock ICLK. The trigger TG2 resets the update command UD_CMD according to the reset signal RST.

In this embodiment, the flip-flops FF1_1 and FF1_2 are coupled in series with each other. Setting input terminals S of the flip-flops FF1_1 and FF1_2 respectively receive the input clock ICLK. The data input terminal D of the flip-flop FF1_1 is coupled to the update command generator 2221, thereby receiving the update command UD_CMD from the update command generator 2221. The output terminal Q of the flip-flop FF1_1 is coupled to the data input terminal D of the flip-flop FF1_2. The output terminal Q of the flip-flop FF1_2 is used to output the enable signal DLL_ACT. In this embodiment, the flip-flops FF1_1 and FF1_2 coupled in series can synchronize with the update command UD_CMD by the first input clock ICLK when the update command UD_CMD is provided, and trigger the logic level of the enable signal DLL_ACT to the first logic level according to the update command UD_CMD at the next input clock ICLK. In other words, the flip-flops FF1_1 and FF1_2 can delay the update command UD_CMD by one input clock ICLK to two input clocks ICLK, thereby generating the enable signal DLL_ACT having the first logic level.

In this embodiment, the counter CNT2 is coupled to an output terminal Q of the flip-flop FF1_2 to receive the enable signal DLL_ACT. The counter CNT2 maintains the enable signal DLL_ACT at the first logic level when receiving the enable signal DLL_ACT and counts the frequency of input clock ICLK. When the frequency of input clock ICLK reaches a first default frequency, the counter CNT2 generates the reset signal RST to reset the update command UD_CMD. When the frequency of input clock ICLK reaches a second default frequency, the counter CNT2 transitions the enable signal DLL_ACT from the first logic level to the second logic level. The second default frequency is greater than the first default frequency. Therefore, before the enable signal DLL_ACT is transitioned to the second logic level, the update command UD_CMD is reset. Therefore, compared to the first embodiment, in this embodiment, the enable signal DLL_ACT can be provided based on the external order of the memory device.

Figure 5:
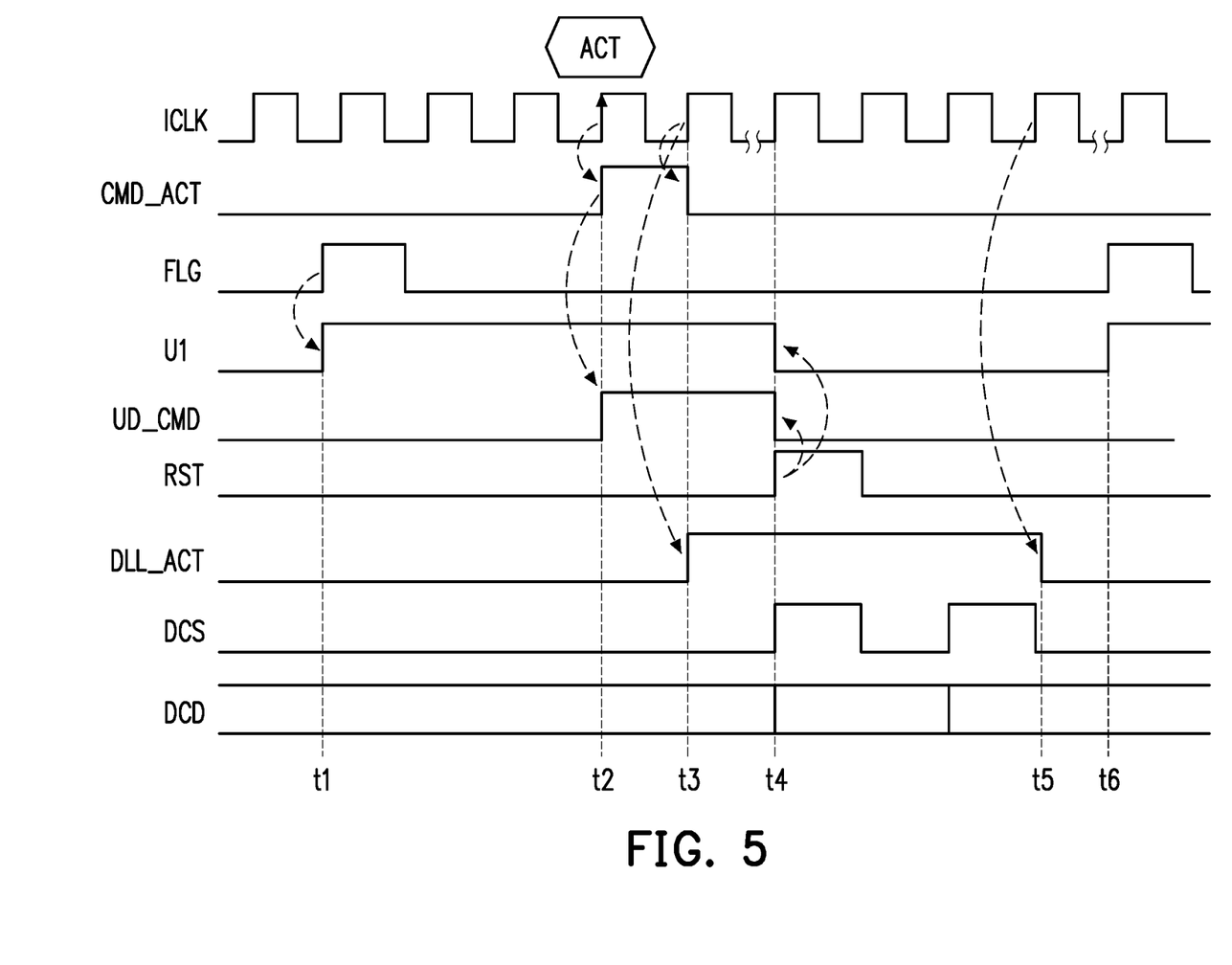
FIG. 5 is a signal timing diagram illustrated according to the second embodiment of the disclosure.

For example, referring to FIG. 1, FIG. 4, and FIG. 5, FIG. 5 is a signal timing diagram illustrated according to the second embodiment of the disclosure. In this embodiment, the flag generating circuit 121 provides the update flag FLG at time point t1 based on the default time interval DT. The default time interval DT is substantially equal to the duration from time point t1 to time point t6 (e.g. 4 microseconds). After the update flag is provided (that is, after time point t1), the logic level of the output terminal U1 of the trigger TG1 is triggered to the first logic level. In the case where the logic level of the output terminal U1 of the trigger TG1 is the first logic level, the update command generator 2221 receives an enable order ACT from an external order of the memory device (the disclosure is not limited thereto), and triggers the enable command CMD_ACT according to the rising edge of the input clock ICLK at time point t2. Therefore, at time point t2, the trigger TG2 triggers the logic level of the update command UD_CMD to the first logic level in response to the rising edge of the enable command CMD_ACT.

At time point t3, when the rising edge of the update command UD_CMD synchronizes with the rising edge of the input clock ICLK (i.e. the first input clock ICLK), the logic level of the enable signal DLL_ACT is triggered to the first logic level at the rising edge of the next input clock ICLK (i.e. the second input clock ICLK). In this embodiment, the enable command CMD_ACT is reset according to the rising edge of the input clock ICLK. In some cases, the update command UD_CMD lags behind the timing of the input clock ICLK due to delay. Therefore, time point t3 is delayed to the rising edge of the next input clock ICLK. The triggering time point of the enable signal DLL_ACT of the disclosure is not limited to time point t3 of this embodiment. At time point t3, the delay locked loop 110 is enabled in response to the DLL_ACT having the first logic level to provide the delayed control signal DCS, and generate a corresponding delay code DCD according to the delay command in the delay control signal DCS.

At time point t3, the counter CNT2 also starts to count the input clock ICLK. In this embodiments, the counter CNT2 counts, for example, the rising edge of the input clock ICLK. When the frequency of input clocks ICLK reaches the first default frequency (for example, 31 times), the counter CNT2 provides the reset signal RST at time point t4. At time point t4, the update command generator 2221 resets the logic level of the output terminal U1 of the trigger TG1 to the second logic level according to the reset signal RST, and resets the update command UD_CMD to the second logic level. Therefore, the duration that the update command UD_CMD maintains at the first logic level (i.e. the duration between time point t2 to time point t4) is close to or equal to 32 times the cycle of the input clock ICLK.

When the frequency of input clocks ICLK reaches the second default frequency (for example, 64 times), the counter CNT2 transitions the enable signal DLL_ACT from the first logic level to the second logic level at time point t5. Therefore, at time point t5, the delay locked loop 110 is disabled in response to the enable signal DLL_ACT having the second logic level.

Figure 6:
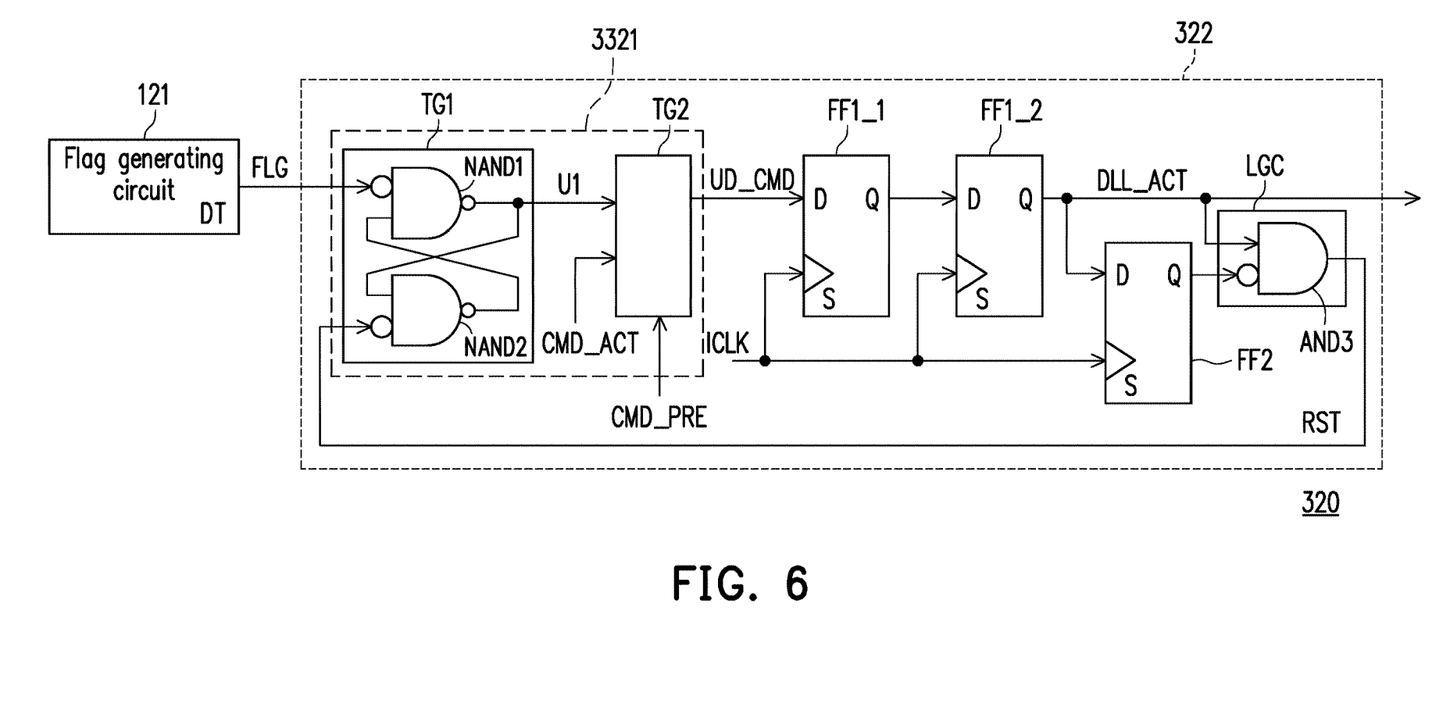
FIG. 6 is a schematic circuit diagram of an update circuit according to the third embodiment of the disclosure.

Referring to both FIG. 1 and FIG. 6, FIG. 6 is a schematic circuit diagram of an update circuit according to the third embodiment of the disclosure. In this embodiment, an update circuit 320 includes the flag generating circuit 121 and an enable circuit 322. The enable circuit 322 includes an update command generator 3321, flip-flops FF1_1 and FF1_2, a flip-flop FF2, and a logic circuit LGC. The update command generator 3321 generates an update command UD_CMD in response to the enable command CMD_ACT when receiving the update flag FLG. Further, in this embodiment, the update command generator 3321 includes the trigger TG1 and the trigger TG2. The trigger TG1 is coupled to the flag generating circuit 121 to update the flag FLG. The trigger TG1 triggers the logic level of the output terminal U1 of the trigger TG1 to the first logic level in response to the rising edge of the update flag FLG. The trigger TG1 also transitions the logic level of the output terminal U1 of the trigger TG1 from the first logic level to the second logic level according to the reset signal RST. The implementation details of the trigger TG1 is sufficiently illustrated in the embodiment of FIG. 4 and will therefore not be repeated here.

In this embodiment, the trigger TG2 is coupled to the output terminal U1 of the trigger TG1. In the case where the logic level of the output terminal U1 of the trigger TG1 is the first logic level, the trigger TG2 triggers the update command UD_CMD in response to the rising edge of the enable command CMD_ACT. In addition, the trigger TG2 resets the update command UD_CMD according to an end command CMD_PRE. In this embodiment, the update command generator 3321 can receive a first external order (for example, an enable order) of the memory device. When receiving the first external order, the update command generator 3321 triggers the enable command CMD_ACT according to the rising edge of the input clock ICLK. In this embodiment, the update command generator 3321 can also receive a second external order (for example, a refresh order) of the memory device. When receiving the second external order, the update command generator 3321 triggers the end command CMD_PRE according to the rising edge of the input clock ICLK. Therefore, in this embodiment, the rising edge of the enable command CMD_ACT synchronizes with the rising edge of the input clock ICLK. The rising edge of the end command CMD_PRE synchronizes with the rising edge of the input clock ICLK.

In this embodiment, the flip-flops FF1_1 and FF1_2 are coupled in series with each other. The setting input terminals S of the flip-flops FF1_1 and FF1_2 respectively receive the input clock ICLK. The data input terminal D of the flip-flop FF1_1 is coupled to the update command generator 3321, thereby receiving the update command UD_CMD from the update command generator 3321. The output terminal Q of the flip-flop FF1_1 is coupled to the data input terminal D of the flip-flop FF1_2. The output terminal Q of the flip-flop FF1_2 is used to output the enable signal DLL_ACT. The data input terminal D of the flip-flop FF2 is coupled to the output terminal Q of the flip-flip FF1_2. The setting input terminal S of the flip-flops FF2 respectively receives the input clock ICLK. The output terminal Q of the flip-flop FF2 delays the enable signal DLL_ACT to generate an internal signal. The logic circuit LGC is coupled to the output terminal Q of the flip-flop FF2 and the output terminal Q of the flip-flop FF1_2. The logic circuit LGC inverts the internal signal, and performs a logic AND operation on the enable signal DLL_ACT and the inverted internal signal to generate a reset signal RST. The reset signal RST is used to reset the logic level of the output terminal U1 of the trigger TG1.

Further, the logic circuit LGC includes an AND gate AND3. The AND gate AND3 receives the enable signal DLL_ACT and the inverted internal signal, and performs a logic AND operation on the enable signal DLL_ACT and the inverted internal signal to generate the reset signal RST. Compared to the first embodiment and the second embodiment, this embodiment does not need the counter to provide the enable signal DLL_ACT and the reset signal RST.

Figure 7:
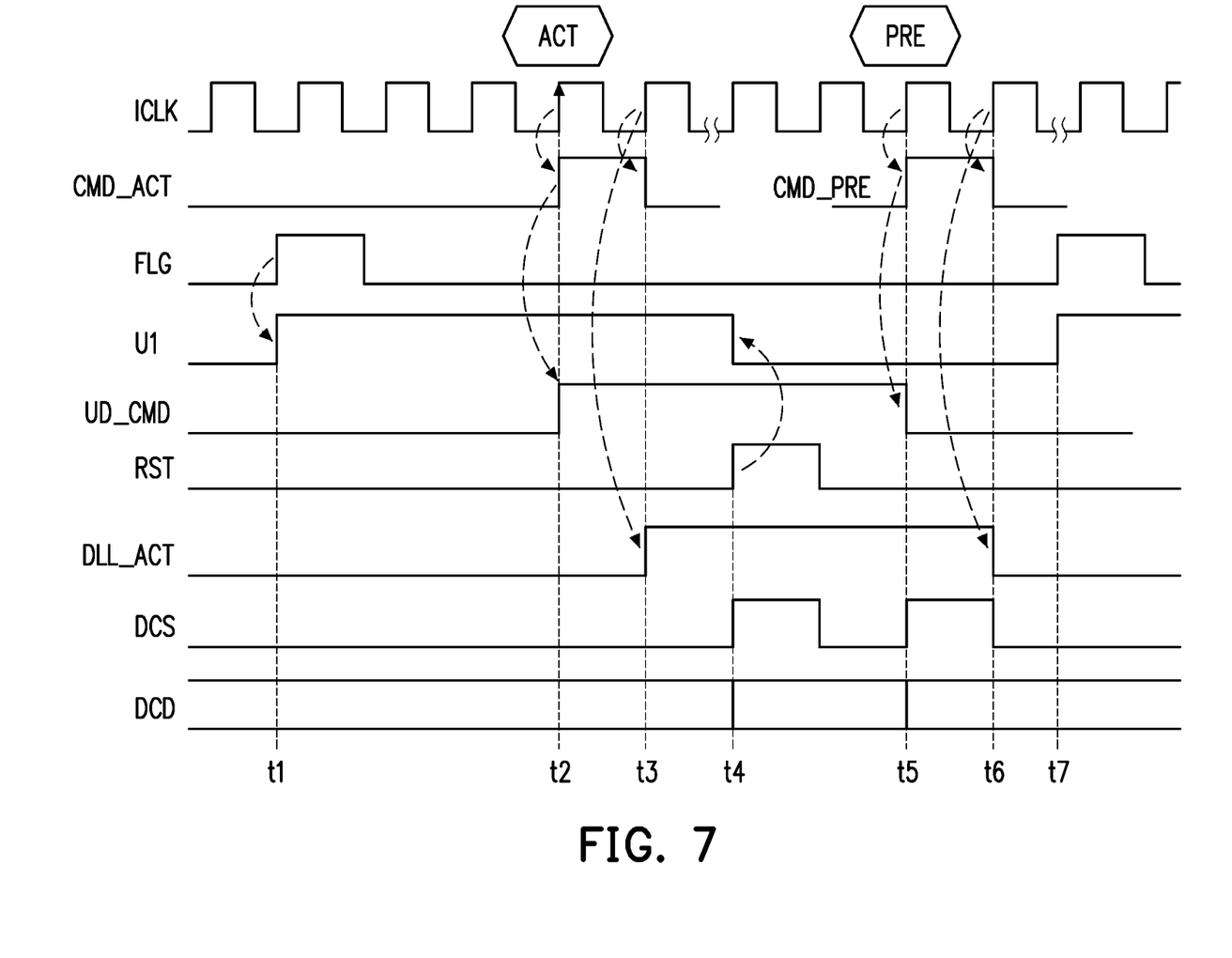
FIG. 7 is a signal timing diagram illustrated according to the third embodiment of the disclosure.

For example, referring to FIG. 1, FIG. 6, and FIG. 7, FIG. 7 is a signal timing diagram illustrated according to the third embodiment of the disclosure. In this embodiment, the implementation details of time points t1 to t3 is sufficiently illustrated in the second implementation and will therefore not be repeated here. At time point t4, the logic circuit LGC generates the reset signal RST. Therefore, at time point t4, the logic level of the output terminal U1 of the trigger TG1 is reset according to the reset signal RST. In this embodiment, the reset signal RST can be delayed to be generated at time point t4. In some embodiments, the reset signal RST can be generated at time point t3, and the disclosure is not limited to the time point at which the reset signal RST is generated.

Then the update command generator 3321 receives a refresh order PRE from the external order (the disclosure is note limited thereto). The update command generator 3321 triggers the end command CMD_PRE according to the rising edge of the input clock ICLK at time point t5. The trigger TG2 resets the logical level of the update command UD-CMD to the second logical level according to the end command CMD-PRD at time point t5. At time point t6, the logic level of the enable signal DLL_ACT is transitioned from the first logic level to the second logic level. Therefore, at time point t6, the delay locked loop 110 is disabled in response to the enable signal DLL_ACT having the second logic level. In this embodiment, the enable command CMD_PRE is reset according to the rising edge of the input clock ICLK at time point t6 (the disclosure is not limited thereto).

Figure 8:
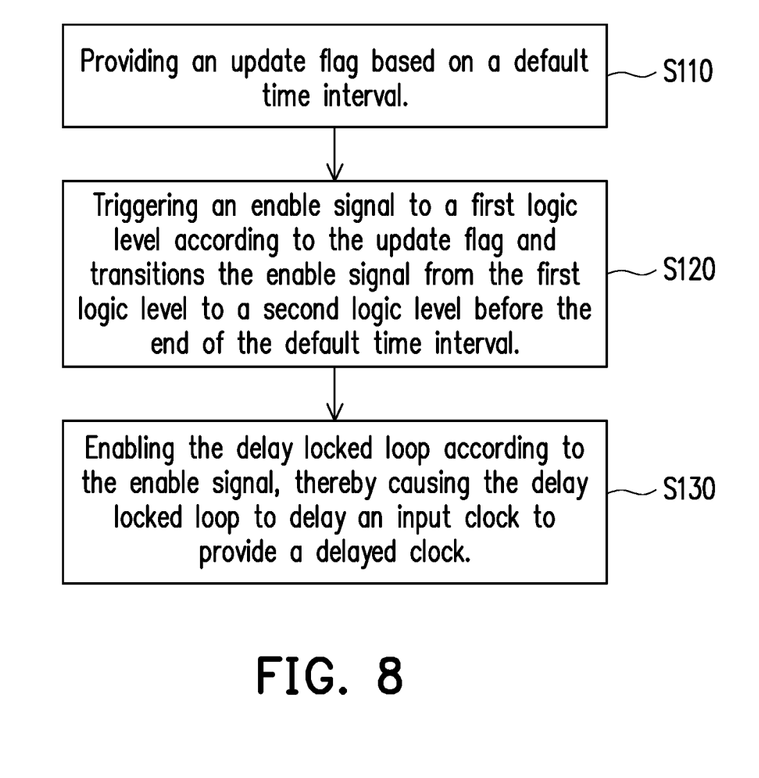
FIG. 8 is a flowchart of an update method according to an embodiment of the disclosure.

Referring to both FIG. 1 and FIG. 8, FIG. 8 is a flowchart of an update method according to an embodiment of the disclosure. In this embodiment, the update method provides the update flag FLG based on the default time interval DT in step S110. The default time interval DT is shorter than the refresh cycle of the memory device. In step S120, the enable flag FLG is triggered to the first logic level according to the update flag FLC, and the enable signal DLL_ACT is transitioned from the first logic level to the second logic level before the end of the default time interval DT. In step S130, the delay locked loop 110 is enabled according to the enable signal DLL_ACT, so that the delay locked loop 110 delays the input clock ICLK to provide the delayed clock DCLK.

In summary, the disclosure provides an update flag based on a default time interval, triggers an enable signal to a first logic level according to the update flag, and transitions the enable signal from the first logic level to a second logic level before the end of the default time interval. The disclosure enables the delay locked loop within the default time interval. Therefore, the delay locked loop updates the delay code only within the default time interval, thereby reducing the power consumption of the delay locked loop. In addition, in the disclosure, the delayed clock provided by the delay locked loop can change instantaneously with temperature when the default time interval is shorter than the refresh cycle of the memory device.

Although the disclosure has been disclosed in the above embodiments, it is not intended to limit the disclosure, and those skilled in the art can make some modifications and refinements without departing from the spirit and scope of the disclosure. Therefore, the scope of the disclosure is subject to the definition of the scope of the appended claims.

What is claimed is:

1. A delay locked loop device adaptable for a memory device, comprising:
    a delay locked loop configured to receive an input clock after being enabled according to an enable signal and delay the input clock to provide a delayed clock; and
    an update circuit, comprising:
        a flag generating circuit configured to provide an update flag based on a default time interval; and
        an enable circuit, coupled to the flag generating circuit and the delay locked loop, configured to trigger an enable signal to a first logic level according to the update flag and transition the enable signal from the first logic level to a second logic level before the end of the default time interval,
    wherein the default time interval is shorter than a refresh cycle of the memory device.

2. The delay locked loop device according to claim 1, wherein the flag generating circuit comprises:
    an oscillator configured to provide an internal clock; and
    a frequency divider, coupled to the oscillator and the enable circuit, configured to divide the internal clock so that a cycle of the internal clock is substantially equal to the default time interval, thereby converting the internal clock into the update flag.

3. The delay locked loop device according to claim 1, wherein the enable circuit comprises:

N flip-flops coupled in series, wherein a data input terminal of a first-stage flip-flop of the N flip-flops is configured to receive the update flag, and setting input terminals of the N flip-flops respectively receive the input clock and trigger the enable signal by an Nth input clock in the default time interval, wherein N is an integer greater than 1; and a counter, coupled to an output terminal of an Nth-stage flip-flop of the N flip-flops, configured to maintain the enable signal at the first logic level when receiving the enable signal and count the frequency of the input clock, wherein the counter transitions the enable signal from the first logic level to the second logic level when the frequency of the input clock reaches a default frequency.

4. The delay locked loop device according to claim 1, wherein the enable circuit comprises:

an update command generator configured to generate an update command in response to an external order of the memory device when receiving the update flag; and N first flip-flops coupled in series, wherein a data input terminal of a first-stage flip-flop of the N first flip-flops is configured to receive the update command, and setting input terminals of the N first flip-flops respectively receive the input clock, thereby triggering the enable signal by an Nth input clock when the update command is generated, wherein N is an integer greater than 1.

5. The delay locked loop device according to claim 4, wherein the update command generator comprises:

a first trigger configured to receive the update flag, trigger a logic level of an output terminal of the first trigger to the first logic level in response to a rising edge of the update flag, and transition the logic level of the output terminal of the first trigger from the first logic level to the second logic level according to a reset signal; and a second trigger configured to, when the logic level of the output terminal of the first trigger is the first logic level, trigger the update command in response to an rising edge of an enable command and reset the update command according to the reset signal.

6. The delay locked loop device according to claim 5, wherein the enable circuit further comprises:

a counter, coupled to an output terminal of an Nth-stage first flip-flop of the N first flip-flops, configured to maintain the enable signal at the first logic level when receiving the enable signal and count the frequency of the input clock, wherein the counter generates the reset signal when the frequency of the input clock reaches a first default frequency, wherein the counter transitions the enable signal from the first logic level to a second logic level when the frequency of the input clock reaches a second default frequency, wherein the second default frequency is greater than the first default frequency.

7. The delay locked loop device according to claim 4, wherein:

the update command generator further generates an end command in response to another external order of the memory device, the update command generator comprises:

a first trigger configured to receive the update flag, trigger an logic level of an output terminal of the first trigger to the first logic level in response to a rising edge of the update flag, and transition the logic level of the output terminal of the first trigger from the first logic level to the second logic level according to a reset signal; and a second trigger configured to, when the logic level of the output terminal of the first trigger is the first logic level, trigger the update command in response to a rising edge of an enable command and reset the update command according to the end command.

8. The delay locked loop device according to claim 7, wherein the enable circuit further comprises:

a second flip-flop, wherein a data input terminal of the second flip-flop is coupled to an output terminal of an Nth-stage first flip-flop of the N first flip-flops, and a setting input terminal of the second flip-flop receives the input clock, wherein the second flip-flip is configured to delay the enable signal to generate an internal signal; and a logic circuit, coupled to an output terminal of the second flip-flop and the output terminal of the Nth-stage first flip-flop, configured to invert the internal signal and perform a logic AND operation on the enable signal and the inverted internal signal to generate the reset signal.

9. An update method for updating a delay locked loop device adaptable for a memory device, the update method comprising:

providing an update flag based on a default time interval, wherein the default time interval is shorter than a refresh cycle of the memory device;

triggering an enable signal to a first logic level according to the update flag and transitioning the enable signal from the first logic level to a second logic level before the end of the default time interval; and enabling the delay locked loop according the enable signal so that the delay locked loop delays an input clock to provide a delayed clock.

10. The update method according to claim 9, wherein the step of providing the update flag based on the default time interval comprises:

providing an internal clock; and dividing the frequency of the internal clock so that a cycle of the internal clock is substantially equal to the default time interval, thereby converting the internal clock into the update flag.

11. The update method according to claim 9, wherein the step of triggering the enable signal to the first logic level according to the update flag and transitioning the enable signal from the first logic level to the second logic level before the end of the default time interval comprises:

triggering the enable signal by an Nth input clock in the default time interval, wherein N is an integer greater than 1;

maintaining the enable signal at the first logic level and counting the frequency of the input clock when receiving the enable signal; and transitioning the enable signal from the first logic level to the second logic level when the frequency of the input clock reaches a default frequency.

12. The update method according to claim 9, further comprising:

generating an update command in response to an external order of the memory device when receiving the update flag; and triggering the enable signal by an Nth input clock when the update command is generated, wherein N is an integer greater than 1.

13. The update method according to claim 12, further comprising:
    triggering the update command in response to a rising edge of an enable command and resetting the update command according to a reset signal.

14. The update method according to claim 13, wherein the step of triggering the enable signal to the first logic level according to the update flag and transitioning the enable signal from the first logic level to the second logic level before the end of the default time interval comprises:
    counting the frequency of the input clock when receiving the enable signal;
    generating the reset signal used to reset the update command when the frequency of the input clock reaches a first default frequency; and
    transitioning the enable signal from the first logic level to the second logic level when the frequency of the input clock reaches a second default frequency, wherein the second default frequency is greater than the first default frequency.

15. The update method according to claim 12, further comprising:
    generating an end command in response to another external order of the memory device; and
    triggering the update command in response to a rising edge of an enable command and resetting the update command according to the end command.

16. The update method according to claim 15, wherein the step of triggering the enable signal to the first logic level according to the update flag and transitioning the enable signal from the first logic level to the second logic level before the end of the default time interval comprises:
    delaying the enable signal to generate an internal signal; and
    inverting the internal signal and performing a logic AND operation on the enable signal and the inverted internal signal to generate the reset signal.

* * * * *